(12) United States Patent
Kim et al.

(10) Patent No.: US 11,982,708 B2
(45) Date of Patent: May 14, 2024

(54) APPARATUS FOR ALIGNING DEVICE HAVING FINE PITCH, APPARATUS FOR TESTING DEVICE HAVING FINE PITCH, AND DEVICE ALIGNMENT METHOD

(71) Applicant: AMT CO., LTD., Asan-si (KR)

(72) Inventors: Du Chul Kim, Cheonan-si (KR); Wan Gu Lee, Cheonan-si (KR)

(73) Assignee: AMT CO., LTD., Asan-si (KR)

( * ) Notice: Subject to any disclaimer, the term of this patent is extended or adjusted under 35 U.S.C. 154(b) by 118 days.

(21) Appl. No.: 17/783,942

(22) PCT Filed: Nov. 3, 2020

(86) PCT No.: PCT/KR2020/015211
§ 371 (c)(1),
(2) Date: Jun. 9, 2022

(87) PCT Pub. No.: WO2021/182708
PCT Pub. Date: Sep. 16, 2021

(65) Prior Publication Data
US 2023/0003793 A1    Jan. 5, 2023

(30) Foreign Application Priority Data

Mar. 12, 2020 (KR) ........................ 10-2020-0030617

(51) Int. Cl.
*G01R 31/28* (2006.01)

(52) U.S. Cl.
CPC ..... *G01R 31/2891* (2013.01); *G01R 31/2893* (2013.01)

(58) Field of Classification Search
CPC .. G01R 31/28; G01R 1/0483; G01R 31/2891; G01R 31/2893; G01R 31/2865; G01R 31/2887

(Continued)

(56) References Cited

U.S. PATENT DOCUMENTS

| | | | |
|---|---|---|---|
| 2006/0154386 A1* | 7/2006 | Cheng | G01R 1/045 438/15 |
| 2009/0051381 A1 | 2/2009 | Hosoda et al. | |
| 2013/0181733 A1* | 7/2013 | Kikuchi | G01R 31/2874 324/750.16 |

FOREIGN PATENT DOCUMENTS

| | | | | |
|---|---|---|---|---|
| CN | 102854441 A | | 1/2013 | |
| JP | 2000100905 A | * | 4/2000 | B65G 49/07 |

(Continued)

OTHER PUBLICATIONS

English translation JP 2000100905 A Positioning Device and Positioning Method Using the Same (Year: 2000).*

(Continued)

*Primary Examiner* — Eman A Alkafawi
*Assistant Examiner* — Courtney G McDonnough
(74) *Attorney, Agent, or Firm* — Paratus Law Group, PLLC

(57) ABSTRACT

An apparatus for aligning a device having a fine pitch includes: a base plate, which has vacuum holes respectively formed at seating points for devices and suctions the devices with the vacuum pressure that allows minute movement as the vacuum pressure is applied in a state in which the devices are loaded; a jig plate, which is fixedly installed so as to be positioned on the upper portion of the base plate and has openings, in which the devices are received, in the same number as the number of the devices loaded on the base plate; and a base plate position adjusting means for finely moving the positions of the devices loaded on the base plate in X-Y-θ directions so as to position the devices in the openings (formed in the jig plate.

8 Claims, 10 Drawing Sheets

(58) Field of Classification Search
USPC .................................................. 324/750.01
See application file for complete search history.

(56) References Cited

FOREIGN PATENT DOCUMENTS

| KR | 10-0376772 | B1 |   | 3/2003  |          |
|----|------------|----|---|---------|----------|
| KR | 10-1464990 | B1 |   | 11/2014 |          |
| KR | 20150003974 | A | * | 1/2015  | ............. G01R 31/26 |
| KR | 10-2017-0078209 | A |   | 7/2017  |          |
| KR | 10-1779172 | B1 |   | 9/2017  |          |
| KR | 10-2018-0052906 | A |   | 5/2018  |          |

OTHER PUBLICATIONS

English translation KR 20150003974 A Multi Socket Device for Die Test (Year: 2015).*
International Search Report for PCT/KR2020/015211 mailed Feb. 16, 2021 from Korean Intellectual Property Office.

* cited by examiner

APPARATUS FOR ALIGNING DEVICE HAVING FINE PITCH, APPARATUS FOR TESTING DEVICE HAVING FINE PITCH, AND DEVICE ALIGNMENT METHOD

CROSS-REFERENCE TO PRIOR APPLICATIONS

This application is a National Stage Patent Application of PCT International Patent Application No. PCT/KR2020/015211 (filed on Nov. 3, 2020) under 35 U.S.C. § 371, which claims priority to Korean Patent Application No. 10-2020-0030617 (filed on Mar. 12, 2020), which are all hereby incorporated by reference in their entirety.

BACKGROUND

The present invention relates to an apparatus for aligning a device having a fine pitch, which enables accurate alignment of a plurality of devices in order to carry out performance tests in a handler after producing the devices such as thin small outline packages TSOPs or ball grid arrays BGAs with small-sized bumps and narrow pitches. The present invention also relates to an apparatus for testing a device having a fine pitch and a device alignment method. More particularly, the present invention relates to an apparatus for aligning a device having a fine pitch, an apparatus for testing a device having a fine pitch, and a device alignment method, in which after loading all devices to be tested on a base plate, the loaded devices are aligned at the same time so that the test thereof can be performed by bringing the ball terminals of the devices into contact with the terminals of a tester at the same time.

In general, semiconductor devices such as ICs are inspected for defects by inspecting electrical characteristics during the manufacturing process thereof. The electrical characteristic test of a semiconductor device is performed by electrically connecting the ball terminals of a semiconductor device and the contact points of a test board including a printed circuit board PCB. Such a test is conducted for a set time so that good products are shipped and defective products are retested or discarded.

Conventionally, devices to be tested are individually transferred to a tester side so as to carry out the test of the electrical characteristics of each device in a state in which the device to be tested is inserted into a carrier.

That is, the electrical test of the device is performed through electrical contact between the ball terminals of the device loaded in the carrier and probe pins supported on a socket assembly. At this time, the ball terminals and the probe pins of a very small size are arranged in a narrow pitch, so very high precision alignment is required during testing. However, the ball terminals and the probe pins are aligned through the mutual alignment of the alignment holes of the carrier and the alignment pins of the socket guide.

PRIOR ART DOCUMENTS (Patent Document 0001) Korean Reg. Patent Publication No. 10-1464990 (Registered on Nov. 19, 2014)
(Patent Document 0001) Korean Reg. Patent Publication No. 10-1779172 (Registered on Sep. 11, 2017)

SUMMARY

However, such a conventional alignment device has several problems as follows.

First, it is impossible to compact the equipment since a device positioned in a loading part is adsorbed and placed in a carrier by a loading picker, the carrier containing the device is transferred to a test side in turn and then the test is carried out for a set time, and the carrier with the device for which the test has been completed is transferred to an unloading part, so that an unloading picker unloads the device after sorting the same as good or bad according to the test result.

Second, since it is necessary to repeat the work of connecting and disconnecting the carrier to and from the socket guide during the test, the margins of the alignment pins and the alignment balls are increased through the repeated connection and disconnection, resulting in the mismatching or offset of the ball terminals and the probe pins.

Third, when conducting a conductivity test on thousands of devices, if the expensive device is damaged due to a collision between the device and the probe pins or the ball terminals of such a damaged device remain in the equipment, replacement or repair work has to be performed while the conductivity test is interrupted, reducing the operation ratio of expensive equipment.

The present invention has been derived to solve such problems and improve a structure in the prior art and has an objective to automatically align the positions of a plurality of devices to be tested at the same time while moving a base plate in X-Y-θ axis directions by a base plate position adjusting means after loading all the devices to be tested on the top surface of the base plate to which vacuum pressure is applied through the openings formed in a jig plate.

Another objective of the present invention is to enable electrical testing of a plurality of devices by moving a base plate to a tester side in a state, in which the positions of the plurality of devices are aligned and the plurality of devices are adsorbed to the base plate by vacuum pressure, and then connecting the ball terminals of the plurality of devices adsorbed to the base plate to the terminals of a tester at the same time, thereby classifying good products and defective products according to the results.

In order to achieve the objectives, according to one aspect of the present invention, there is provided an apparatus for aligning a device having a fine pitch, including a base plate, which has vacuum holes respectively formed at seating points for devices and suctions the devices with vacuum pressure that allows minute movement as the vacuum pressure is applied in a state in which the devices are loaded, a jig plate, which is fixedly installed so as to be positioned on the upper portion of the base plate and has openings, in which the devices are received, in the same number as the number of the devices loaded on the base plate, and a base plate position adjusting means for finely moving the positions of the devices loaded on the base plate in X-Y-θ directions so as to position the devices in the openings formed in the jig plate, wherein the base plate is finely moved in the X-Y-θ directions by the base plate position adjusting means in a state, in which the devices are received in the respective openings formed in the jig plate and suctioned to the base plate, so that the plurality of devices are aligned at the same time.

According to another aspect of the present invention, there is provided an apparatus for testing a device having a fine pitch, including a frame, a loading part and an unloading part provided at both ends of the frame, a jig plate, which is installed in the loading part and has a plurality of openings in which a plurality of devices 30 are received, an aligner for aligning the plurality of devices received in the openings of the jig plate, a Z-axis motor for lifting or lowering the aligner, a rail installed over the loading part and the unloading part, a transfer means, on which the Z-axis motor is fixed and which moves horizontally along the rail, and a tester for testing the performance of the plurality of devices aligned by the aligner.

According to a further aspect of the present invention, there is provided a method for aligning a device having a fine pitch, including the steps of sequentially loading devices on the upper surface of a base plate having vacuum holes through each of a plurality of openings formed in a jig plate, suctioning the devices with vacuum pressure that allows minute movement as the vacuum pressure is applied in a state in which the devices are loaded, and moving the base plate finely in X-Y-θ directions by a base plate position adjusting means so as to align the devices by guiding each of the devices to two sides of each of the openings, wherein the devices loaded on the base plate are aligned at the same time.

The present invention has the following advantages over the prior art.

First, a plurality of devices was sequentially loaded onto the base plate and then suctioned with vacuum pressure that allows fine movement, and in a state in which the devices suctioned to the base plate are inserted in the openings of the jig plate, the base plate is moved finely in the X-Y-θ directions by the base plate position adjusting means so that the plurality of devices is aligned at the same time, thereby maximizing the utilization ratio of the equipment.

Second, testing is performed by electrically connecting a plurality of devices to a tester at the same time without using any separate carrier so that mismatching or offset between the ball terminals of the devices and the probe pins is prevented in advance and the test efficiency of the expensive equipment is maximized.

Third, the alignment precision is maximized owing to the excellent positioning performance of the base plate position adjusting means and frictional force reduction.

DETAILED DESCRIPTION

Figure 1:
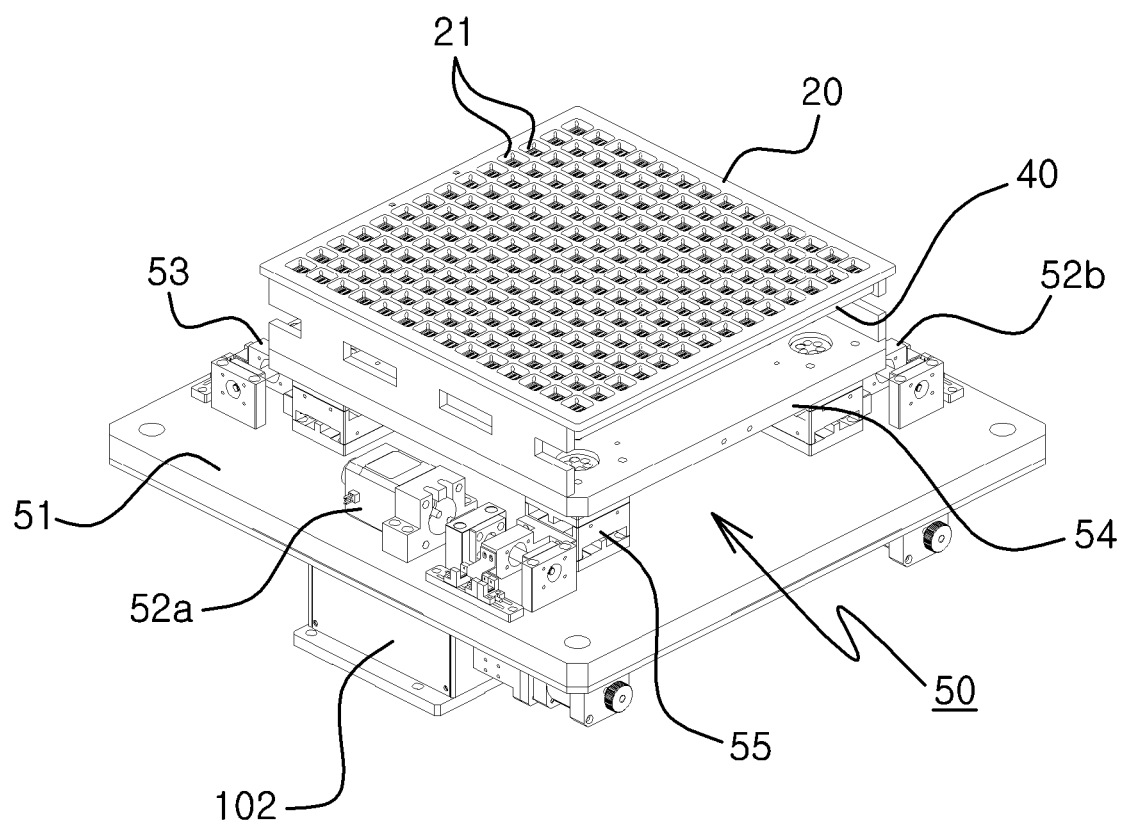
FIG. 1 is a perspective view for showing an embodiment of the present invention.

Hereinafter, with reference to the accompanying drawings, embodiments of the present invention will be described in detail such that those of ordinary skill in the art can easily implement them. The present invention may be implemented in several different forms and is not limited to the embodiments described herein. It should be noted that the drawings are schematic and not drawn to scale. Relative dimensions and proportions of parts in the drawings are shown exaggerated or reduced in size for clarity and convenience in the drawings and any dimensions are illustrative only and not limiting. In addition, the same reference numerals are used to denote like features to the same structure, element, or part appearing in two or more drawings.

Figure 2:
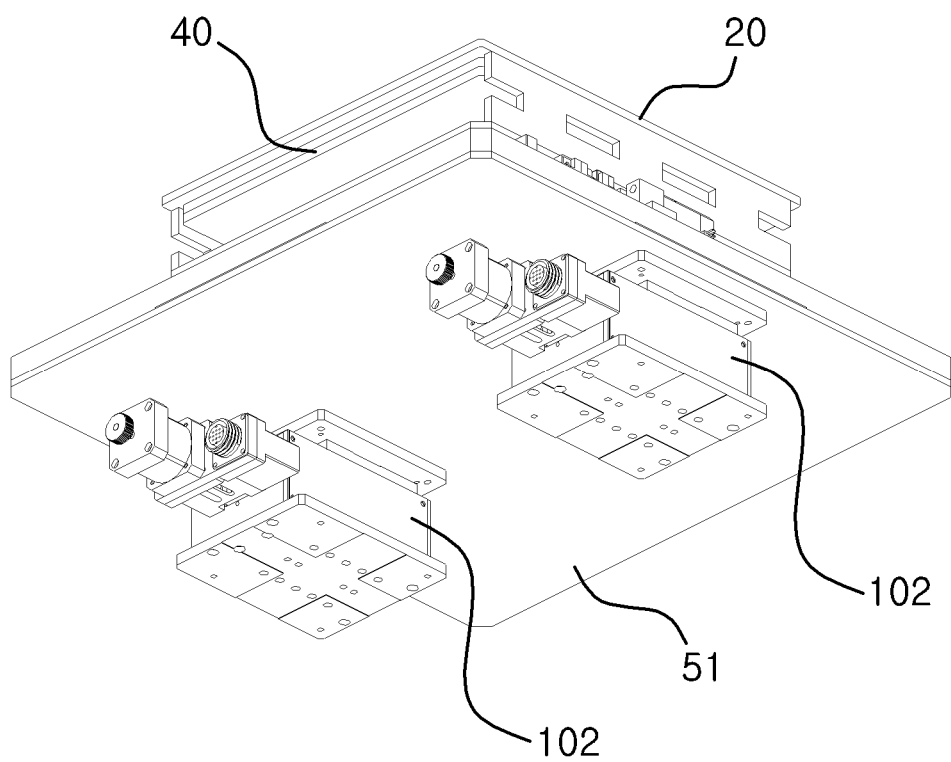
FIG. 2 is a bottom perspective view of FIG. 1, FIG. 3a and FIG. 3b are plan views of FIG. 1 excluding a jig plate and a base plate, respectively.
Figure 3A:
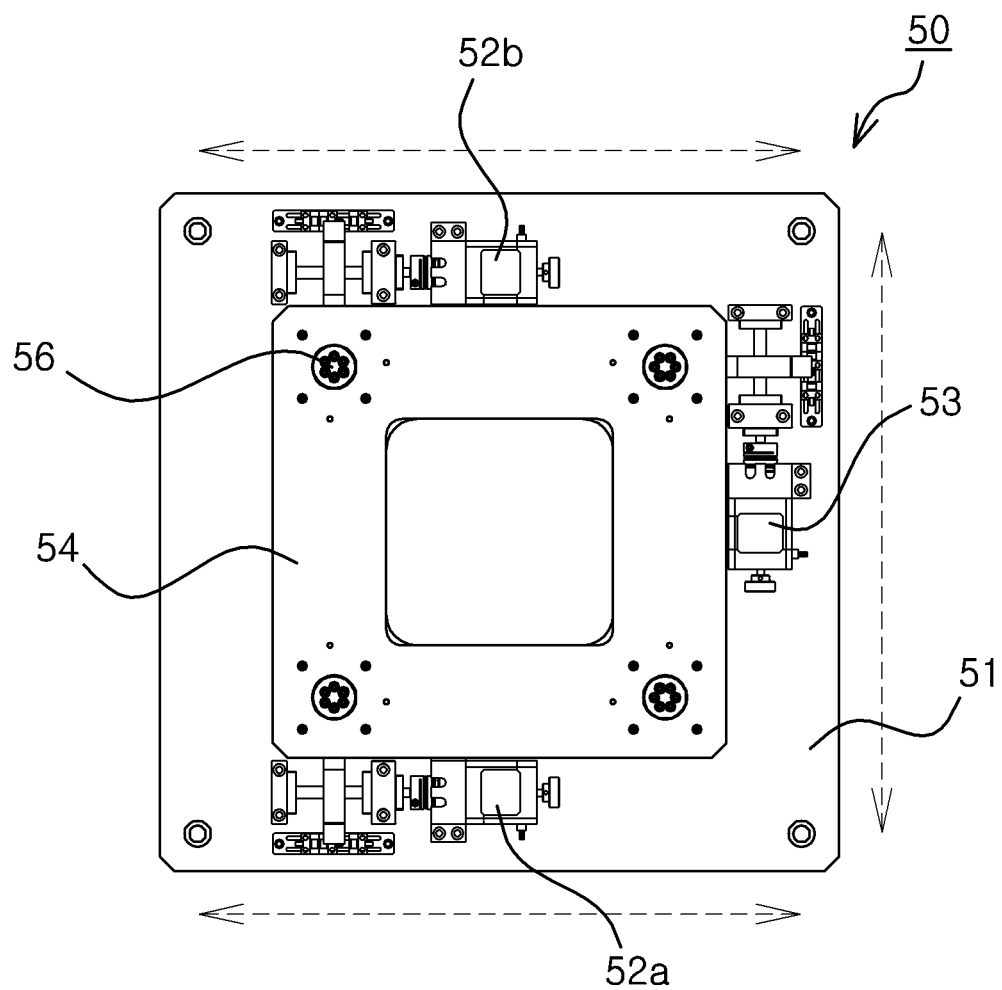
Figure 3B:
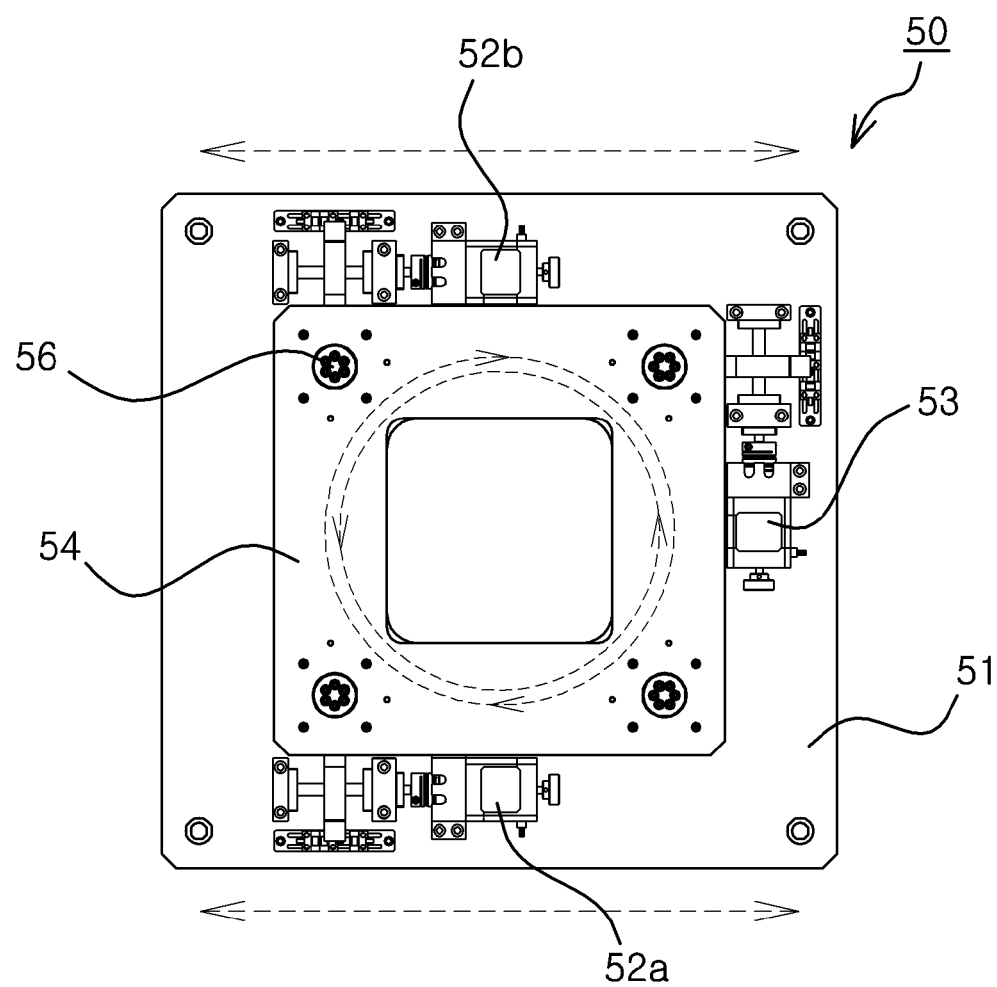
Figure 6A:
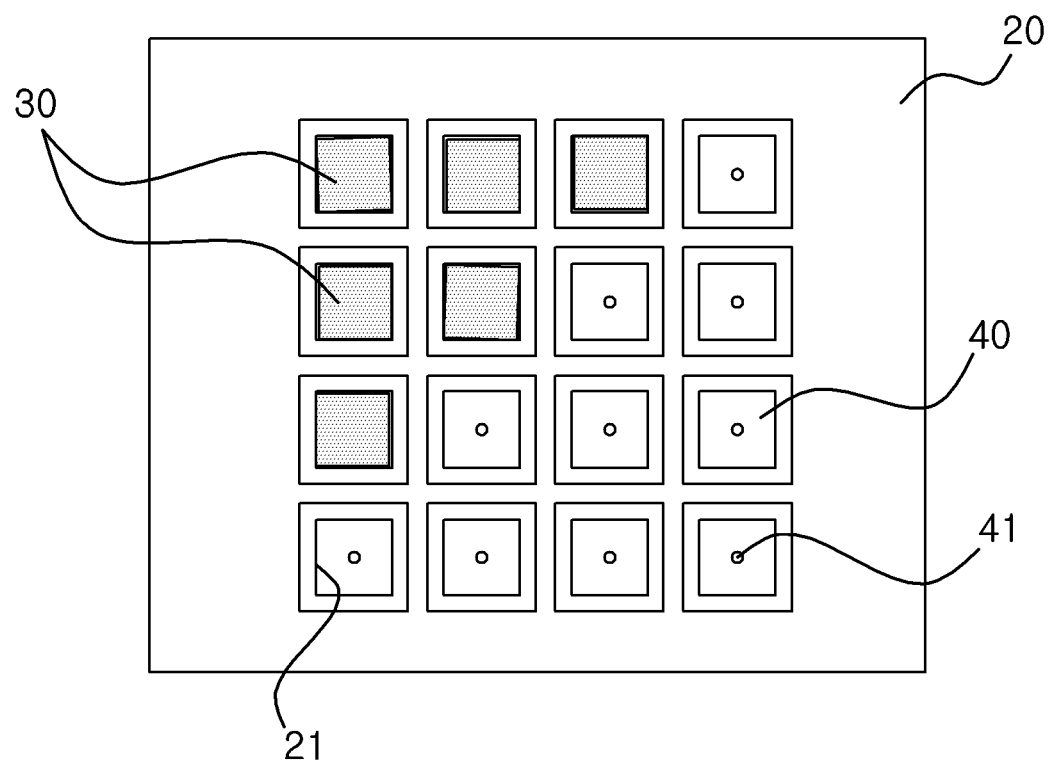
FIG. 6a is a plan view for showing a state in which devices are inserted into the openings of a jig plate and seated on a base plate in the present invention.

FIG. 1 is a perspective view for showing an embodiment of the present invention, FIG. 2 is a bottom perspective view of FIG. 1, and FIG. 3a and FIG. 3b are plane views of FIG. 1 excluding a jig plate and a base plate, respectively. According to the present invention, a plurality of vacuum holes 41 are formed, as shown in FIG. 6a, in the top surface of a base plate 40 on which devices 30 to be tested are loaded by a loading means such as a picker (not shown). Herein, the devices 30 are suctioned with primary vacuum pressure (about 5 to 50 mmHg) when aligning the devices 30 loaded on the base plate 40. In addition, the devices 30 are suctioned with secondary vacuum pressure (about 50 to 100 mmHg) after the alignment is completed, so that the aligned devices 30 are prevented from moving during the transfer of the base plate 40.

In one embodiment of the present invention, although the base plate 40 is shown in a square shape, it can be applied in various shapes, such as a rectangle or a circle, as necessary.

A heater and a cooling pipe (not shown) are installed in the base plate 40 so that the base plate 40 is maintained at room temperature, or heated to about 50 to 170° C., or cooled to about 0 to −55° C. according to test conditions for the devices 30, before loading the devices 30 on the upper surface of the base plate 40.

Even if the base plate 40 is formed of a material having a minimum coefficient of expansion (such as ceramics or the like), assuming that one side of the base plate 40 is 300 mm, the base plate 40 expands or contracts within the range of about 0.3 mm by heating or cooling. Therefore, before loading the devices 30 on the upper surface of the base plate 40, the temperature of the base plate 40 is adjusted according to test conditions so as to minimize errors due to the expansion or contraction of the base plate 40.

The base plate 40 is provided with a jig plate 20 on the upper portion thereof, and the jig plate 20 has the same number of openings 21 as the number of the devices 30 loaded on the base plate 40 so that the devices 30 to be tested are loaded on the base plate 40 and then suctioned through the respective openings 21 with vacuum pressure that allows minute movement. Then, a base plate position adjusting means 50 provided under the base plate 40 finely moves the base plate 40 in X-Y-θ directions so that the plurality of devices 30 are aligned at the same time.

Figure 5A:
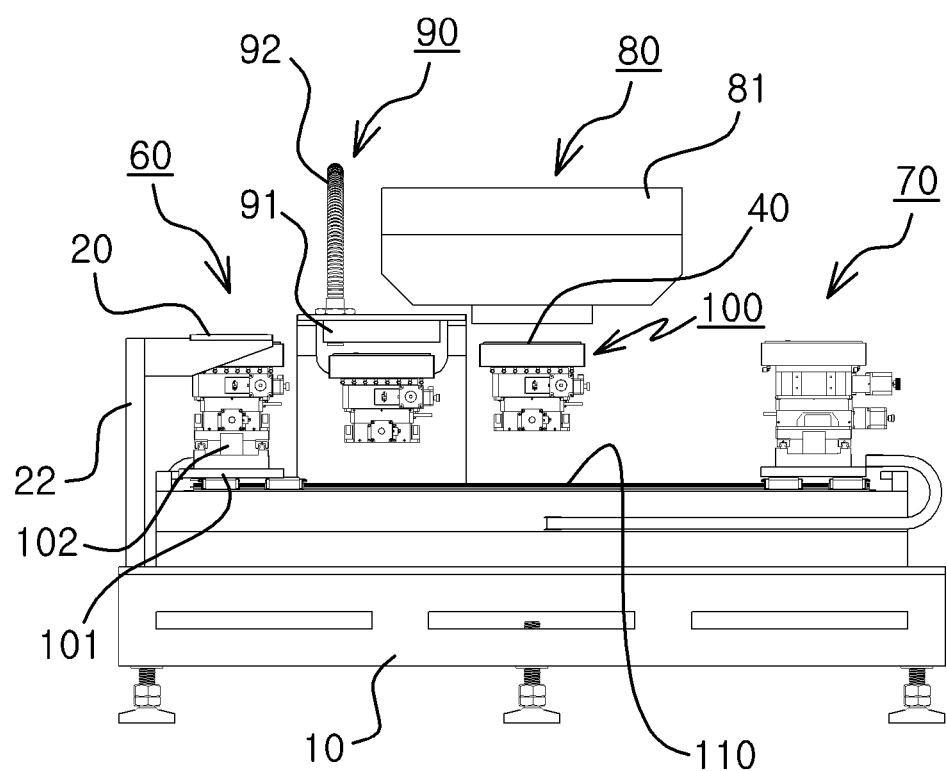
FIG. 5a and FIG. 5b are a front view and a top view of FIG. 4, respectively.

At this time, it could be understood that the jig plate 40 is installed to be suspended in a cantilever form on a structure such as a frame 10 by means of an additional support 22, as shown in FIG. 5a which shows another embodiment.

According to an embodiment of the present invention, as shown in FIGS. 3a and 3b, the base plate position adjusting means 50 for finely moving the base plate 40 in the X-Y-θ directions includes an installation plate 51 installed so as to ascend or descend, one pair of X-axis motors 52a, 52b installed opposite to the installation plate 51, a Y-axis motor 53 installed on the installation plate 51 so as to be orthogonal to the X-axis motors, a moving plate 54 installed so as to move finely in the X-Y-θ directions by the X-axis motors 52a, 52b and the Y-axis motor 53, four cross rollers 55 installed between the installation plate 51 and the moving plate 54 so as to allow the moving plate 54 to move in the X-Y axis directions, and a shaft 56 for rotatably coupling the moving plate 54 to the respective cross rollers 55.

The cross roller 55 includes a multi-stage plate having X- and Y-axis LM guides (not shown).

The base plate position adjusting means 50 shown as an embodiment of the present invention is a known ready-made product produced by MISUMI (model name: AA-300-35).

It could be understood that the base plate position adjusting means 50 can be modified and applied in various forms by those of ordinary skill in the art.

Figure 4:
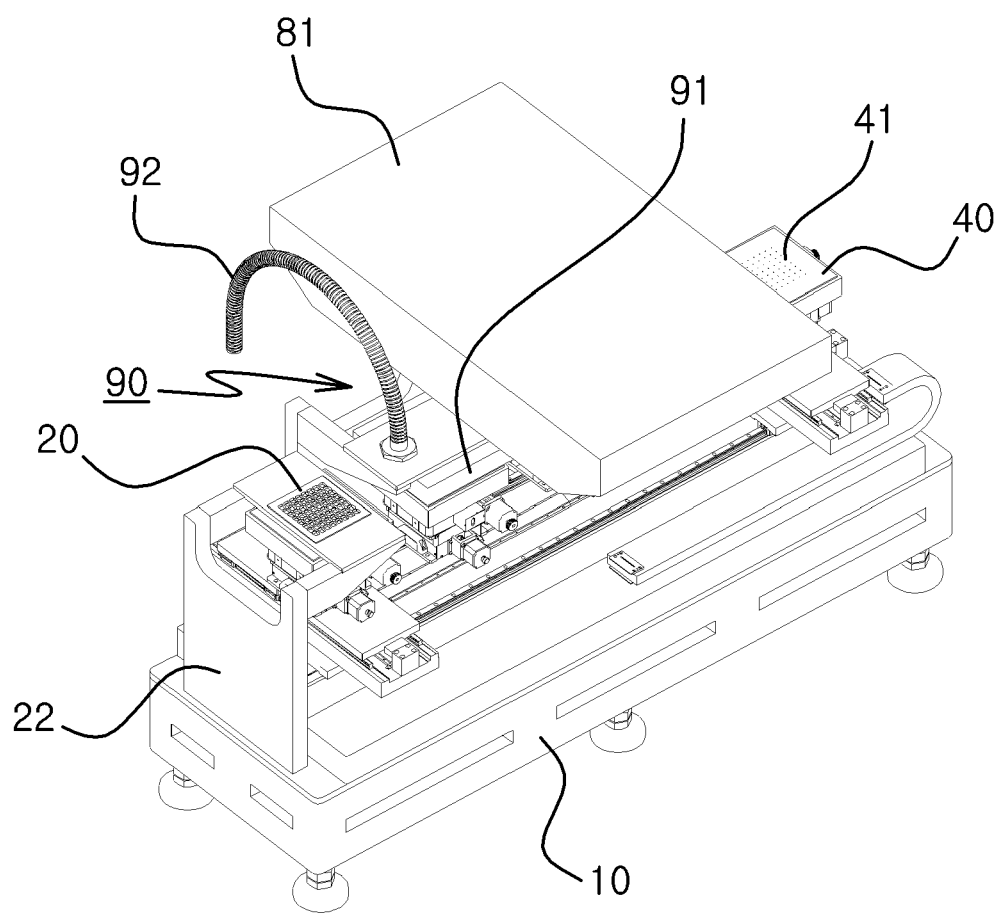
FIG. 4 is a perspective view for showing another embodiment of the present invention.
Figure 5B:
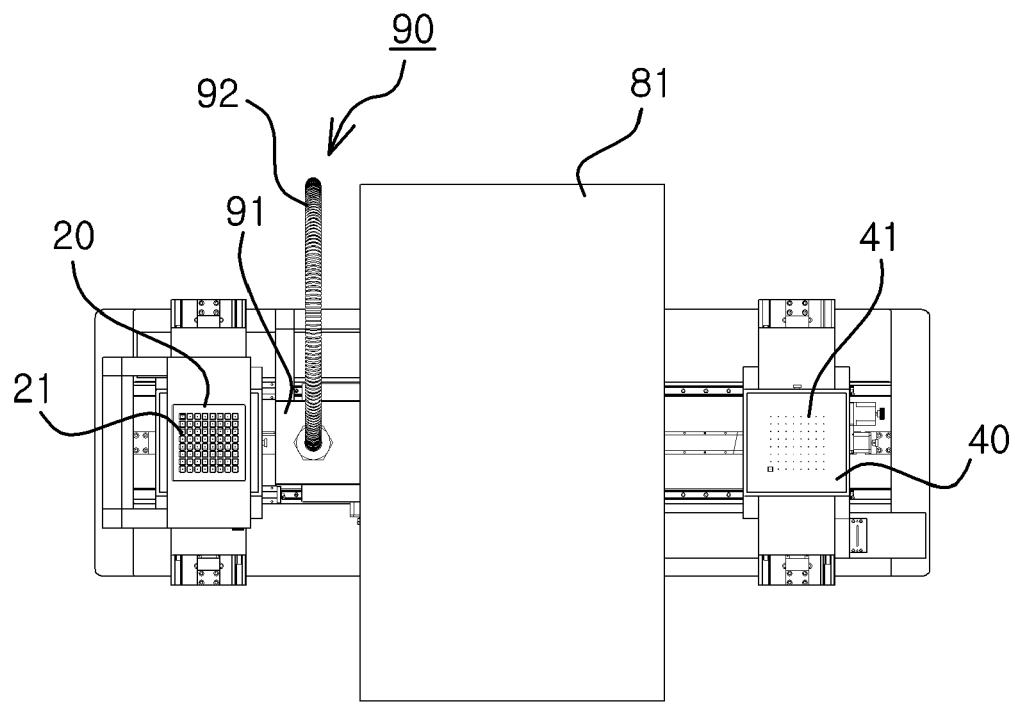

FIG. 4 is a perspective view for showing another embodiment of the present invention, and FIG. 5a and FIG. 5b are a front view and a top view of FIG. 4, respectively. A loading part 60 is provided at one end (left side in the drawings) of the frame 10 so as to load the devices 30 to be tested sequentially onto the base plate 40, an unloading part 60 is provided at the other end (right side in the drawings) of the frame 10 so as to classify the devices 30 for which a test has been completed in a test part 80 into good products and defective products according to the test results, the test part 80 is provided between the loading part 60 and the unloading part 70 so as to simultaneously test the plurality of aligned devices 30, and a tester 81 is provided immediately on the upper portion of the test part 80 so as to simultaneously test the devices 30 aligned on the base plate 40.

The jig plate 20 that has the plurality of openings 21 for the alignment of the devices 30 is provided in the cantilever form on the loading part 60 by the support 22 fixed to the frame 10, and an aligner 100 for aligning the devices 30 loaded through the openings 21 is provided at the lower portion of the jig plate 20, wherein the aligner 100 is configured to ascend or descend by the Z-axis motor 102 installed on the transfer means 101 which moves horizontally along the rail 110.

Herein, the aligner 100 ascends or descends by the driving of the Z-axis motor 102 in the loading part 60, the test part 80, and the unloading part 70, respectively.

According to another embodiment of the present invention, the aligner 100 includes a base plate 40, which has vacuum holes 41 respectively formed at seating points for devices 30 and suctions the devices 30 with vacuum pressure that allows minute movement as the vacuum pressure is applied in a state in which the devices 30 are loaded, and a base plate position adjusting means 50 for finely moving the positions of the devices 30 loaded on the base plate 40 in X-Y-θ directions through the openings 21 formed in the jig plate 20, wherein the base plate 40 is finely moved in the X-Y-θ directions by the base plate position adjusting means 50 in a state, in which the devices 30 are received in the respective openings 21 formed in the jig plate 20 and suctioned to the base plate 40, so that the plurality of devices 30 are aligned at the same time.

In the present invention, even when only the loading part 60, the test part 80, and the unloading part 70 are provided in the frame 10, the test part 80 can perform an electrical test for the plurality of devices 30 which are suctioned to the base plate 40 so as to be aligned. However, since the time taken for testing the devices 30 in the test part 80 is long compared to the time taken for loading and aligning the plurality of devices 30 on the base plate 40, it is more preferable to further include a device purge part 90 for purging the plurality of devices 30 so as to prevent the devices suctioned to the base plate 40 from being exposed to the air.

If the devices 30 are exposed to the air, since frost or oxidation occurs due to a temperature difference, there is a problem in that the terminals of the devices are stained, resulting in poor vision or poor contact.

As shown in FIG. 5a, the device purge part 90 includes a cover 91 for hermetically surrounding the base plate 40, on which the devices 30 are aligned, by lifting the base plate 40 by the Z-axis motor 102, and a supply pipe 92 for supplying nitrogen $N_2$ gas to the inside of the cover 91.

The operation of the present invention will now be described as follows.

Figure 7:
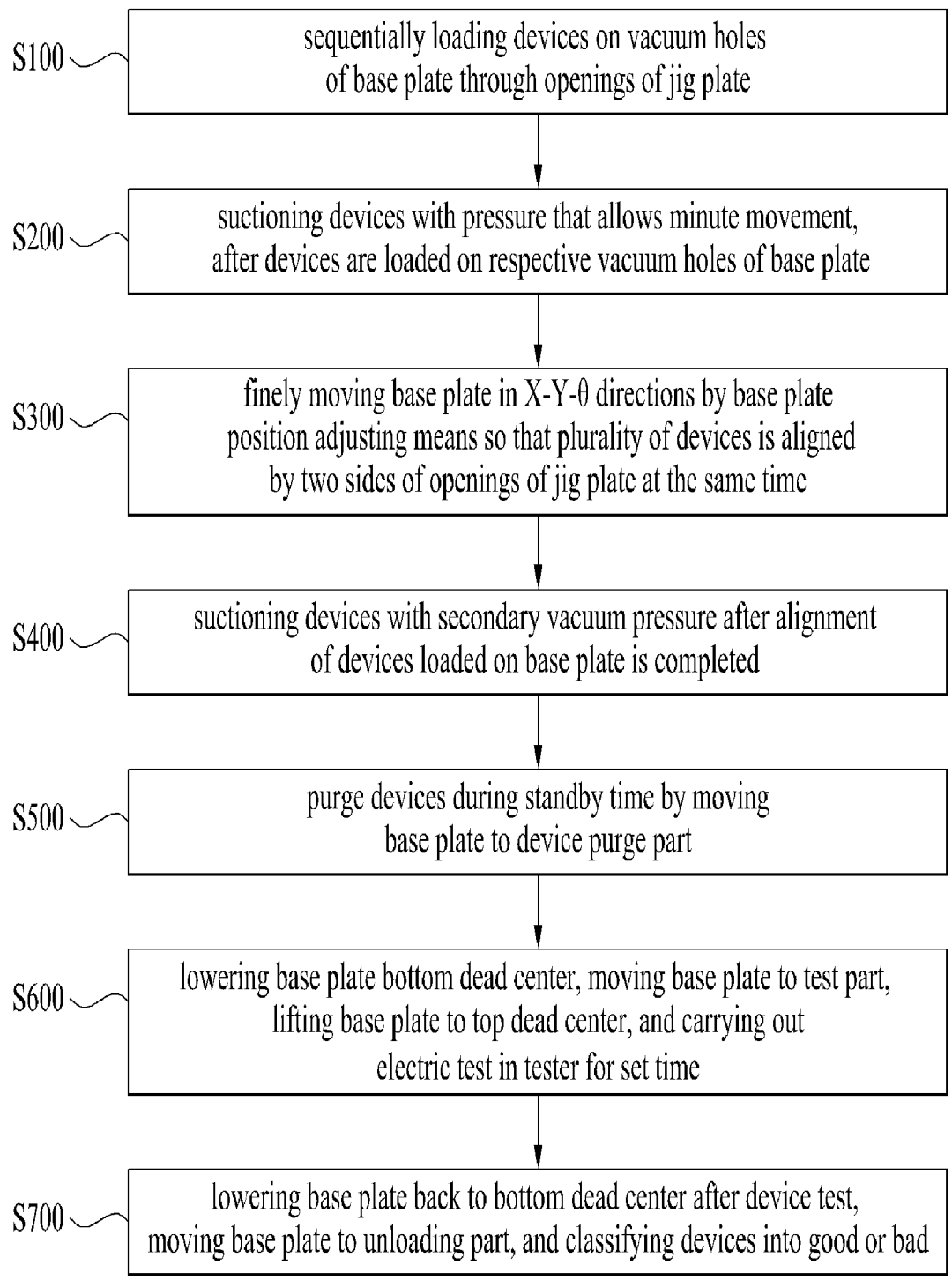
FIG. 7 is a flowchart for explaining the alignment method of the present invention.

FIG. 7 is a flowchart for explaining the alignment method of the present invention. In a state where the base plate 40 is lifted, as in FIG. 3a or FIG. 5a, to the top dead center and is positioned directly below the jig plate 20 at a predetermined interval (lower than the height of the devices), the base plate 40 is maintained at room temperature, or heated to about 50 to 170° C., or cooled to about 0 to −55° C. according to test conditions for the devices 30, before loading the devices 30 on the upper surface of the base plate 40.

In the state where the base plate 40 is maintained at a temperature suitable for the test conditions of the device 30 as described above, when the devices 30 positioned on the loading part (not shown) are sequentially picked a picker (not shown) and placed in the vacuum holes 41 of the base plate 40 through the openings 21 of the jig plate 20, the devices 30 are suctioned by a vacuum device (not shown) installed in connection with the vacuum holes 41, wherein the devices 30 are suctioned with vacuum pressure of about 5 to 50 mmHg that allows the minute movement (S100, S200).

It is possible to suction the devices 30 each time the picker picks and places the devices 30 on the vacuum holes 41 of the base plate 40. However, if the devices 30 are suctioned at once in a state in which all the devices 30 are loaded on the respective vacuum holes 41 of the base plate 40, the number of required parts is significantly reduced and control becomes advantageous, thereby reducing production costs.

The devices 30 mounted on the vacuum holes 41 of the base plate 40 through the openings 21 formed in the jig plate 20 have arbitrary postures as shown in FIG. 6a.

Figure 6B:
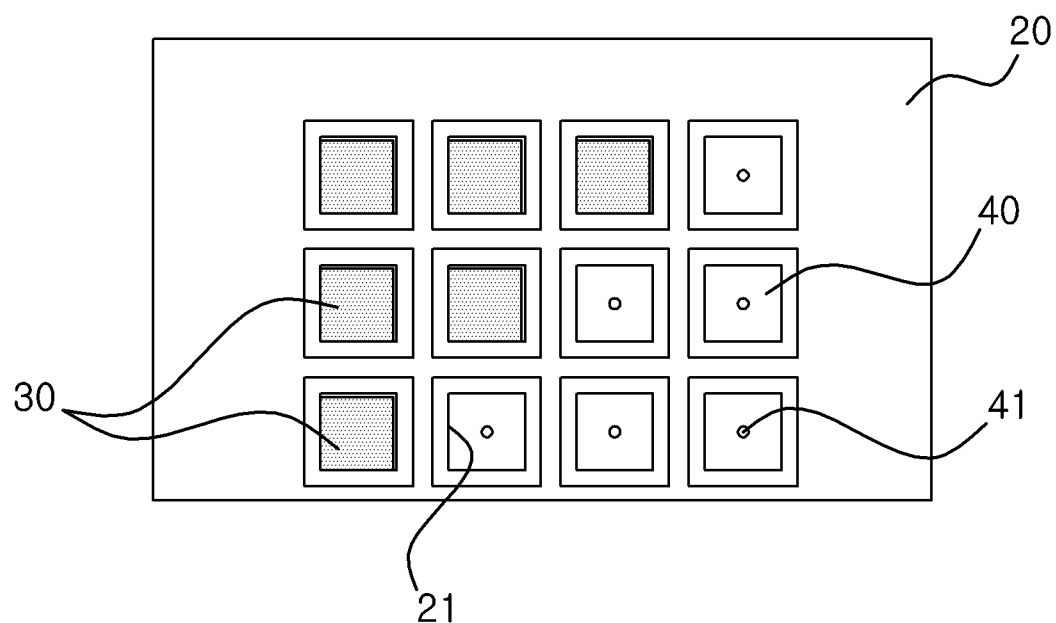
FIG. 6b is a view for showing a state in which device alignment is completed in the openings formed in the jig plate by finely moving the base plate in X-Y-θ directions in the present invention.

As described above, in the state, in which the picker in the loading part 60 picks and loads all the devices 30 to be tested on the seating holes 41 of the base plate 40 through the respective openings 21 formed in the jig plate 20 and the devices 30 are suctioned with the vacuum pressure of about 5 to 50 mmHg that allows the minute movement, when the two X-axis motors 52a, 52b, which are the base plate position adjusting means 50, are driven in the same direction, the moving plate 54 moves in the X-axis direction. In addition, when the Y-axis motor 53 is driven forward or backward, the moving plate 54 is moved in the Y-axis direction. If the two X-axis motors 52a, 52b are driven in the opposite directions to each other, the moving plate 54 moves finely in the direction. Therefore, the base plate 40 moves in the X-Y-θ directions so that the plurality of devices 30 which are suctioned to the base plate 40 so as to be finely-movable come into close contact with two sides of the openings 21, as shown in FIG. 6b. Therefore, the plurality of devices 30 are aligned at the same time (S300).

Such an alignment can be implemented because the moving plate 54 is finely moved in the X-Y axis directions by the cross rollers 55 and also rotates finely in the θ direction by the shaft 56.

When aligning the device 30 by finely moving the device 30 in the X-Y-θ directions by the base plate position adjusting means 50 as described above, it is more preferable to correct the position of the device 30 in a state where the bottom surface of the jig plate 20 is spaced apart from the top surface of the base plate 40.

This is to prevent the generation of particles in advance, which may occur due to friction when aligning the position of the device 30 while the bottom surface of the jig plate 20 moves in contact with the top surface of the base plate 40.

After aligning the devices 30 by correcting the positions of the devices 30 suctioned to all the vacuum holes 41 of the base plate 40 by the above operation, the devices are suctioned at vacuum pressure of about 50 to 100 mmHg so that the positions of the devices 30 are not changed due to vibration or the like during transfer (S400).

After suctioning the devices 30 to the base plate 40 with the vacuum pressure of 50 to 100 mmHg so as to prevent movement, the X- and Y-axis motors 52a, 53 are driven so that the devices 30 are separated from the inner surfaces of the openings 21, and then the Z-axis motor 102 installed on the transfer means 101 is driven so that the base plate 40 is lowered to the bottom dead center.

After the base plate 40 descends to the bottom dead center as described above, the transfer means 101 is moved to the test part 80 by the control unit (not shown) and then stopped. Then, the Z-axis motor 102 is driven again so that the base plate 40 ascends to the top dead center so that the ball terminals of the devices 30 suctioned to the base plate 40 are connected to the terminals of the tester 81 at the same time. Therefore, it is possible to conduct an electrical test of the devices 30 for a set time (S600).

While the test part 80 carries out the electrical characteristics test of the devices 30 for the set time as described above, the loading part 60 loads new devices to be tested next on a new base plate 40a so that the new devices are aligned in the above described manner, wherein the time required for aligning all of the plurality of devices on the base plate 40a is shorter than the time required for testing the devices 30 by the tester 81.

Therefore, if the devices are left in the aligned state on the base plate 40a, frost or oxidation occurs on the surfaces of the devices. Therefore, after transferring a transfer means 101a to the device purge part 90, the base plate 40a is lifted to the top dead center by the Z-axis motor 102, hermetically surrounded with the cover 91, and then purge is carried out by supplying nitrogen gas N₂ through the supply pipe 92 (S500).

After performing the electrical test of the devices 30 suctioned to the base plate 40 in the test part 80, the base plate 40 is lowered again to the bottom dead center by the Z-axis motor 102, and then the transfer means 101 is transferred to the unloading part 70. Therefore, another picker picks and unloads the devices for which the test is completed after classifying the devices into good products and defective products (S700).

It could be understood that a plurality of devices to be tested are seated on the vacuum holes 41 of the base plate 40 through the openings 21 formed in the jig plate 20 in the loading part as described above and then the devices are aligned at the same time by the jig plate 20 in the same manner as described above.

Although embodiments of the present invention have been described with reference to the accompanying drawings, those of ordinary skill in the art to which the present invention belongs can understand that the present invention may be implemented in other specific forms without changing the technical spirit or essential features.

Therefore, the embodiments described hereinabove are to be understood as illustrative and not restrictive in all respects, the scope of the present invention described in the above detailed description is indicated by the following claims, and all changes or modifications derived from the meaning and scope of the claims and their equivalents should be construed as being included in the scope of the present invention.

| Explanation of Reference Signs | |
|---|---|
| 10: frame | 20: jig plate |
| 21: openings | 30: device |
| 40: base plate | 41: vacuum holes |
| 50: base plate position adjusting means | 51: installation plate |
| 52a, 52b: X-axis motors | 53: Y-axis motor |
| 54: moving plate | 55: cross rollers |
| 56: shaft | 60: loading part |
| 70: unloading part | 80: test part |
| 81: tester | 90: device purge part |
| 91: cover | 92: supply tube |
| 100: aligner | 101: transfer means |
| 102: Z-axis motor | 110: rail |

The invention claimed is:

1. An apparatus for aligning a device having a fine pitch, comprising:
   a base plate, which has vacuum holes respectively formed at seating points for devices and suctions the devices with the vacuum pressure that allows minute movement as the vacuum pressure is applied in a state in which the devices are loaded;
   a jig plate, which is fixedly installed so as to be positioned on the upper portion of the base plate and has openings, in which the devices are received, in the same number as the number of the devices loaded on the base plate; and
   a base plate position adjusting means for finely moving the positions of the devices loaded on the base plate in X-Y-θ directions so as to position the devices in the openings formed in the jig plate,
   wherein the base plate is finely moved in the X-Y-θ directions by the base plate position adjusting means in a state, in which the devices are received in the respective openings formed in the jig plate and suctioned to the base plate, so that the plurality of devices is aligned at the same time, and
   wherein a heater and a cooling pipe are installed inside the base plate.

2. The apparatus for aligning a device having a fine pitch according to claim 1, wherein
   the base plate position adjusting means includes:
   an installation plate installed so as to ascend or descend;
   one pair of X-axis motors installed opposite to the installation plate;
   a Y-axis motor installed on the installation plate so as to be orthogonal to the X-axis motors;
   a moving plate installed so as to move finely in the X-Y-e directions by the X-axis motors and the Y-axis motor;
   four cross rollers installed between the installation plate and the moving plate so as to allow the moving plate to move in the X-Y axis directions; and
   a shaft for rotatably coupling the moving plate to the respective cross rollers.

3. An apparatus for testing a device having a fine pitch, comprising:
   a frame;

a loading part and an unloading part provided at both ends of the frame;

a jig plate, which is installed in the loading part and has a plurality of openings in which a plurality of devices is received;

an aligner for aligning the plurality of devices received in the openings of the jig plate;

a Z-axis motor for lifting or lowering the aligner;

a rail installed over the loading part and the unloading part, a transfer means, on which the Z-axis motor is fixed and which moves horizontally along the rail;

a tester for testing the performance of the plurality of devices aligned by the aligner; and a device purge part provided between the loading part and a tester part.

4. The apparatus for testing a device having a fine pitch according to claim 3, wherein the device purge part includes a cover for hermetically surrounding the base plate on which the devices are aligned, and a supply pipe for supplying nitrogen gas to the inside of the cover.

5. The apparatus for testing a device having a fine pitch according to claim 3, wherein the aligner includes:

a base plate, which has vacuum holes respectively formed at seating points for devices and suctions the devices with vacuum pressure that allows minute movement of the devices as the vacuum pressure is applied in a state in which the devices are loaded; and a base plate position adjusting means for finely moving the positions of the devices loaded on the base plate in X-Y-O directions so as to position the devices in the openings formed in a jig plate, wherein the base plate is finely moved in the X-Y-θ directions by the base plate position adjusting means in a state, in which the devices are received in the respective openings formed in the jig plate and suctioned to the base plate, so that the plurality of devices is aligned at the same time.

6. A method for aligning a device having a fine pitch, comprising the steps of:

sequentially loading devices on the upper surface of a base plate having vacuum holes through each of a plurality of openings formed in a jig plate;

suctioning the devices with vacuum pressure that allows minute movement of the devices as the vacuum pressure is applied in a state in which the devices are loaded; and moving the base plate finely in X-Y-θ directions by a base plate position adjusting means so as to align the devices by guiding each of the devices to two sides of each of the openings, wherein the devices loaded on the base plate are aligned at the same time, wherein after the jig plate completes the alignment by correcting the positions of the devices, the device is spaced apart from the two sides of the opening and then the base plate is lowered.

7. The method for aligning a device having a fine pitch according to claim 6, further comprising the step of suctioning the device with secondary pressure so as to prevent the movement of the device, after the alignment of the device is completed.

8. The method for aligning a device having a fine pitch according to claim 7, wherein the secondary pressure is 50-100 mmHg.

* * * * *